(12) United States Patent
Kaminski (10) Patent No.: US 7,148,754 B2
(45) Date of Patent: Dec. 12, 2006

(54) SELF-TUNABLE PHASE LOCK LOOP

(75) Inventor: Gerhard Kaminski, Fuerth (DE)

(73) Assignee: Lucent Technologies Inc., Murray Hill, NJ (US)

( * ) Notice: Subject to any disclaimer, the term of this patent is extended or adjusted under 35 U.S.C. 154(b) by 34 days.

(21) Appl. No.: 11/026,562

(22) Filed: Dec. 30, 2004

(65) Prior Publication Data

US 2006/0145768 A1   Jul. 6, 2006

(51) Int. Cl.
    *H03L 7/06* (2006.01)
(52) U.S. Cl. .............................. 331/11; 331/25; 455/260
(58) Field of Classification Search ................ 331/1 A, 331/10, 11, 14, 16–18, 25, DIG. 2
    See application file for complete search history.

(56) References Cited

U.S. PATENT DOCUMENTS

| | | | | |
|---|---|---|---|---|
| 5,130,670 | A | | 7/1992 | Jaffe ................................ 331/2 |
| 5,408,196 | A | * | 4/1995 | Sempel et al. ................ 329/325 |
| 5,892,408 | A | | 4/1999 | Binder ........................... 331/44 |
| 5,942,949 | A | | 8/1999 | Wilson et al. .................. 331/17 |
| 6,525,616 | B1 | | 2/2003 | Williams et al. ............... 331/44 |

OTHER PUBLICATIONS

"CGS410 Programmable Clock Generator", Sep. 1995, National Semiconductor Corporation.
"Integrated RF Building Blocks for Base Station Applications", 2002, University of Oulu.
Search Report dated Aug. 3, 2006 for EP Application No. 04258172.8.
"A Low Cost High Stability Microcontroller Compensated Crystal Oscillator" by N. Scott Demo, et al - 1998.
"Patent Abstract of Japanese Publication No. 020022721", Fukukawa Shinichi, Aug. 1, 1990.

* cited by examiner

*Primary Examiner*—David Mis (57) ABSTRACT

The present invention provides a method and an apparatus for selectively pretuning and updating a phase lock loop, deployed in an integrated circuit including an agile radio, such as a wideband or an ultra wideband frequency agile radio in a telecommunication system, for example, a reconfigurable multiband and/or multistandard mobile communication system. In one embodiment, a phase lock loop may comprise a digital storage having a first desired frequency. An oscillator may provide an oscillator frequency and a frequency generator circuit capable of producing at least one control signal may cause the oscillator to adapt the oscillator frequency based on the first desired frequency in response to a trigger signal. A pretune unit may apply a pretune voltage to a tuning element to cause the oscillator to calibrate the oscillator frequency to the first desired frequency. An output voltage may be added at the output of a loop filter to the pretune voltage to tune the output voltage of the loop filter such that to set the oscillator frequency substantially at the first desired frequency. An update unit may automatically determine whether one or more parameters of a phase lock loop unit have changed to dynamically update the pretune voltage.

25 Claims, 6 Drawing Sheets

SELF-TUNABLE PHASE LOCK LOOP

BACKGROUND OF THE INVENTION

1. Field of the Invention

This invention relates generally to telecommunications, and more particularly, to wireless communications.

2. Description of the Related Art

Wide frequency tuning phase lock loop (PLL) systems may be used for a variety of mobile communication systems, including a global system for mobile communications (GSM), a universal mobile telecommunications system (UMTS), a wideband code division multiple access (WCDMA), a CDMA2000, a wide local area network (WLAN, and the like. For example, reconfigurable frequency generation PLL systems and wide tuning PLL systems may be deployed within terminals or handsets, such as mobile stations or base stations of such systems.

A phase-lock loop (PLL) is a device that generates a periodic output signal that has a constant phase and frequency relationship with respect to a periodic input signal. Many electronic systems use internal clocks that are required to be phase aligned to and/or frequency multiples of some external reference clock. For example, a reference clock is applied to an integrated circuit chip to drive a PLL, which then drives the system's clock distribution. The primary function of the PLL is to compare the distributed clock to the incoming reference clock, and vary the phase and frequency of its output until the reference and feedback clocks are substantially phase and frequency matched.

In a wide frequency tuning PLL system, a complete desired frequency span is separated into sub-ranges. However, all frequency spans of those sub-ranges normally overlap each other considerably, but due to tolerance issues, those predefined (designed-in) frequency sub-ranges may be changed during a lifetime of the system because of a host of factors, such as temperature and aging. There is no quality information about the actual design centering of those systems running in the field. In fast frequency hopping systems, a settling time and a phase-noise are two conflicting requirements such that both cannot be optimized at the same time. Therefore, any compromise between "speed" and "noise" leads to non-optimal solutions.

In wide tuning and/or fast hopping systems, a frequency span is subdivided into several sub-ranges. For each range, a special separate tuning element is included. This tuning element is switched on/off if required and an oscillator runs within the chosen sub-range. To this end, switching on/off capacitors or inductors may be accomplished by a switch matrix, which requires numerous radio frequency (RF) switches and/or tuning-elements placed "around" the oscillator. This architecture results in a poor oscillator design, leading to a significantly inferior performance. Alternatively, another well-known architecture utilizes a bank of oscillators, essentially meaning that the oscillator, which covers the actual tuning range will be switched "on," which is relatively expensive to implement.

Accordingly, some shortcomings of the above mentioned solutions include a tolerance problem in the field, a complicated oscillator design with poor quality, no provision of a feedback and/or a quality test in the field, no provision for an update in the field, and lack of availability of information of the actual design centering in the field, causing a system to run "out of order." If the system runs out of "range," a base station may cease to function. As a consequence, an overall performance of a mobile network may be unacceptable because of many dropped calls. Other significant shortcomings of these solutions include a static and not adaptive system, parameters that are designed in and cannot be changed, inability to adapt to changes of the oscillator characteristic, a poor PLL settling time and a poor phase noise, a relatively large production spread without the possibility of self-alignment, and a requirement of an extreme wide tuning sub-ranges in order to cover all tolerance problems.

The present invention is directed to overcoming, or at least reducing, the effects of, one or more of the problems set forth above.

SUMMARY OF THE INVENTION

In one embodiment of the present invention, a phase lock loop comprises a digital storage having a first desired frequency. In the phase lock loop, an oscillator may provide an oscillator frequency and a frequency generator circuit capable of producing at least one control signal may cause the oscillator to adapt the oscillator frequency based on the first desired frequency in response to a trigger signal.

In another embodiment, an integrated circuit comprises a phase lock loop unit including a loop filter having an output and an oscillator with an associated tuning element to provide an oscillator frequency. The integrated circuit further comprises a frequency generator circuit including an adder having an output. The frequency generator circuit may be coupled to the phase lock loop unit. The frequency generator circuit may include a pretune unit to apply a pretune voltage to the tuning element to cause the oscillator to calibrate the oscillator frequency to a desired frequency. The adder may add an output voltage at the output of the loop filter to the pretune voltage to tune the output voltage of the loop filter such that to set the oscillator frequency substantially at the desired frequency. An update unit may be coupled to the pretune unit to automatically determine whether one or more parameters of the phase lock loop unit have changed to dynamically update the pretune voltage.

In yet another embodiment, an agile radio comprises a phase lock loop including a digital storage having a first desired frequency. The agile radio further comprises an oscillator to provide an oscillator frequency and a self-calibrating frequency generator circuit capable of producing at least one control signal to cause the oscillator to adapt the oscillator frequency based on the first desired frequency in response to a trigger signal.

In still another embodiment, a telecommunication system comprises an agile radio having a phase lock loop including a digital storage to store a plurality of desired frequencies including a first and a second desired frequency to adapt the phase lock loop. The agile radio further comprises an oscillator coupled to the digital storage and a self-calibrating frequency generator circuit that may hold one or more actual valid control voltages/currents. The self-calibrating frequency generator circuit may steer the oscillator to the first desired frequency of the plurality of desired frequencies in response to a trigger signal. The phase lock loop further includes a control logic to provide the trigger signal to cause at least one of pretune the phase lock loop to the second desired frequency of the plurality of desired frequencies and update the one or more actual valid control voltages/currents in the digital storage with a new actual valid control voltage/current of the oscillator.

In a further embodiment, a method is provided for selectively pretuning and updating a phase lock loop. The method includes storing a plurality of desired frequencies including a first and a second desired frequency to adapt the phase lock loop, holding one or more actual valid control voltages/currents to enable a self-calibration in the phase lock loop when generating the plurality of desired frequencies, and, in response to a trigger signal, steering an oscillator associated with the phase lock loop to the first desired frequency of the plurality of desired frequencies.

In one illustrative embodiment, an apparatus is provided for selectively pretuning and updating a phase lock loop. The method includes means for storing a plurality of desired frequencies including a first and a second desired frequency to adapt the phase lock loop, means for holding one or more actual valid control voltages/currents to enable a self-calibration in the phase lock loop when generating the plurality of desired frequencies, and means for steering an oscillator associated with the phase lock loop to the first desired frequency of the plurality of desired frequencies in response to a trigger signal.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which will vary from one implementation to another. Moreover, it should be appreciated that such a development effort might be complex and time-consuming, but may nevertheless be a routine undertaking for those of ordinary skill in the art having the benefit of this disclosure.

Generally, an extension of a standard phase lock loop (PLL) (e.g., integer or fractional-N) includes a self-calibrating frequency generator, a pretune unit and an update unit, enabling pretuning and updating of a PLL in an agile radio, such as a wideband or ultra-wideband reconfigurable frequency agile radio. The extended PLL configuration may comprise an analog to digital converter (ADC), a digital to analog converter (DAC), a digital storage, control logic and an adder. The primary purpose of the extended PLL configuration is to hold one or more actual valid control voltages/currents for steering an oscillator of the standard PLL to one or more desired frequencies digitally stored in the digital storage. For example, a self-calibrating or reconfigurable frequency generator circuit may be coupled to a phase lock loop unit within an agile radio, enabling wideband or ultra-wideband wireless communications from a wireless device, e.g., a cellular phone in a cell of a digital cellular network. In this manner, using the self-calibrating or reconfigurable frequency generator circuit to pretune and/or update the phase lock loop unit, an agile radio located within either a mobile station or a base station may provide multiband and/or multistandard coverage for a user in a wireless network of a mobile communication system.

Figure 1:
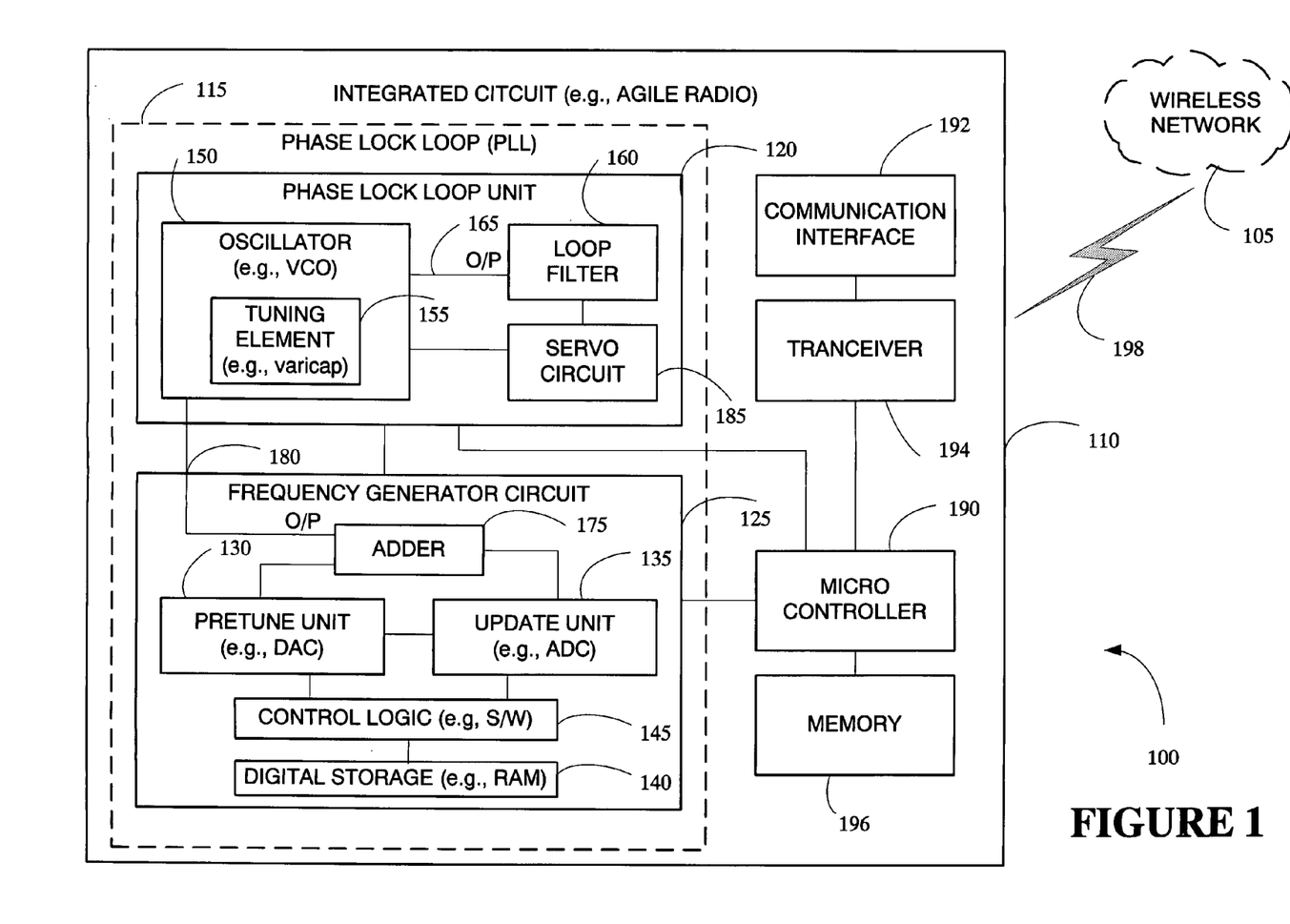
FIG. 1 illustrates a telecommunication system including a wireless network to communicate with an integrated circuit (e.g., an agile radio) comprising a phase lock loop (PLL) that includes a PLL unit coupled to a frequency generator circuit having a pretune unit and an update unit for selectively pretuning and updating the phase lock loop according to one illustrative embodiment of the present invention.

Referring to FIG. 1, a telecommunication system 100 includes a wireless network 105 to communicate with an integrated circuit (e.g., an agile radio) 110 comprising a phase lock loop (PLL) 115 that includes a PLL unit 120 coupled to a frequency generator circuit 125 having a pretune unit 130 and an update unit 135 for selectively pretuning and updating the phase lock loop 115 according to one illustrative embodiment of the present invention. The frequency generator circuit 125 may produces frequencies. That is, the frequency generator circuit 125 generates voltages/currents and stores voltages/currents related to frequencies.

In the PLL 115, the frequency generator circuit 125 may comprise a digital storage 140 to store a plurality of desired frequencies including a first and a second desired frequency to adapt the PLL unit 120 and a control logic 145 to provide a trigger signal. The PLL unit 120 may include an oscillator 150 coupled to the digital storage 140. A tuning element 155 may be associated with the oscillator 150 to provide an oscillator frequency. The phase lock loop unit 120 may include a loop filter 160 having an output (O/P) 165.

The frequency generator circuit 125 may hold one or more actual valid control voltages/currents to steer the oscillator 150 to the first desired frequency of the plurality of desired frequencies in response to the trigger signal. The trigger signal may cause at least one of pretune the phase lock loop 115 to the second desired frequency of the plurality of desired frequencies and update the one or more actual valid control voltages/currents in the digital storage 140 with a new actual valid control voltage/current of the oscillator 150. That is, the control logic 145 may cause the pretune unit 130 to generate a tuning voltage associated with a new frequency channel and may cause the update unit 135 to compensate for a change in one or more characteristics of the oscillator 150.

According to one embodiment, the frequency generator circuit 125 further comprises an adder 175 having an output 180. The adder 175 may add a pretune signal (voltage/current) to the output of the loop-filter 160. Furthermore, this pretune signal may control the tuning element 155 directly. The update unit 135 coupled to the pretune unit 130 may automatically determine whether one or more parameters of the PLL unit 120 have changed to dynamically update the pretune voltage. The pretune unit 130 may apply a pretune voltage to the tuning element 155 to cause the oscillator 150 to calibrate the oscillator frequency to the first desired frequency.

Using the pretune unit 130 of the PLL 115, in one embodiment, a reconfigurable wide tuning frequency generator of a mobile communication system may be adapted to work in different frequency bands. In one approach, this reconfigurable wide tuning frequency generation system typically requires a bank of oscillators and/or PLLs, while another approach involves working with multi-loop PLLs. In all of these applications, a (wide) tuning range of a sub-oscillator is not stable due to changes based on many factors, such as temperature and aging. A conventional analog PLL system is able to provide a limited tuning voltage range, e.g., 0.7V to 4.5V. However, this range may be extended by adding a pretune voltage, building wide tuning applications.

In operation, the phase lock loop unit 120 tunes the output 165 of the loop filter 160 to a voltage in such way that both the sum of a digital to analog output from the pretune unit 130 and the output 165 of the loop filter 160 is substantially a control voltage which steers the oscillator 150 to the desired frequency. The adder 175 may add an output voltage at the output 165 of the loop filter 160 to the pretune voltage to tune the output voltage of the loop filter 160, setting the oscillator frequency substantially at the first desired frequency.

Consistent with one embodiment, the phase lock loop unit 120 further comprise a servo circuit 185 coupled to the loop filter 160 to lock a phase lock loop in the phase lock loop unit 120. The integrated circuit 110 may comprise a micro controller 190 to program the phase lock loop unit 120. Besides the micro controller 190, the integrated circuit 110 may further comprise a conventional communication interface 192 for signal reception and transmission coupled to a conventional transceiver 194 for signal processing, which in turn, coupled to a memory 196 that stores one or more typical communication protocols for cooperatively establishing a wireless communication over a wireless medium 198 with the wireless network 105.

The servo circuit 185 may comprise a reference counter, a radio frequency (RF) counter and a phase comparator. While an external reference frequency (not depicted, as part of the PLL unit 120) may be divided by "R," the oscillator 150 output frequency may be divided by "N." Both the divided output frequency signals may be connected to the phase comparator and the output of this phase comparator may be proportional to a phase offset between both the divided output frequency signals. The PLL 115 may be locked, if (the external reference frequency)/R=(the oscillator output frequency)/N. The output of the phase comparator may be fed to the loop-filter 160. After integration, the loop filter 160 output may be changed in such way, that the above relationship is fulfilled.

The pretune and update units 130, 135 shown in FIG. 1 may map the actual valid "frequency vs. control" characteristic of the oscillator 150 to the digital storage 140 (e.g., a random access memory (RAM) of <1 kilobyte having multiple address numbers to store RAM addresses). The address numbers of the digital storage 140 may be related one-to-one (1:1) to the one or more desired frequency channels of the telecommunication system 100. Triggered by an external logic, such as a trigger signal (i.e., indicating that the PLL unit 120 either to be tuned to a new frequency or an update is desired) an appropriate address number of the digital storage 140 is activated and the related oscillator control voltage (or current) is transferred to the tuning element 155 (e.g. a variable capacitor (Varicap)) of the oscillator 150 and a desired output frequency may be generated perhaps with some small residual error.

After that, a fine-tuning of the desired frequency may be performed by the servo circuit 185 of the PLL unit 120. After the settling time (parameter), an actual valid (e.g., new) control voltage/current of the oscillator 150 may be converted from analog to digital and stored back into the digital storage 140 under the same address, causing the update. This ensures that a latest update of the desired frequency (channel) is stored. The update is useful because in PLL unit 120, one or more oscillator-parameters may be influenced by factors including temperature, aging, and power supply.

The pretune and update units 130, 135 of the PLL unit 120 in an agile radio, such as a wideband or an ultra wideband frequency agile radio may dynamically update (actualize) the phase lock loop 115 by performing an update "on the fly." The agile radio may determine whether a particular frequency band is currently used or not, emit in that frequency band if not used, and switch to another band in microseconds if another user begins to emit in that frequency band. The wideband frequency agile radio allows a signal to be spread across a range of frequencies, trading off power for bandwidth. In the ultra wideband frequency agile radio, the signal to be transmitted is capture in small intervals and the signal is converted to a set of very small pulses and these pulses are broadcast over a very wide bandwidth.

By mapping an actual valid "frequency vs. control" function to the digital storage 140, the pretune and update units 130, 135 may provide a fast settling time without worsening the phase noise behavior of the PLL unit 120. Both the pretune and update units 130, 135 ideally may pose no problems due to any tolerance changes in the field for the PLL unit 120. The pretune and update units 130, 135 may thus deliver quality figures of the PLL unit 120 operational in the field because they may be used to adapt a loop-filter gain to an actual slope of the "frequency vs. control" function. The pretune and update units 130, 135 may provide an automatic calibration (update) for the PLL unit 120, making it easy to use during production (self alignment). Since the pretune and update units 130, 135 may provide an exact pretune as a latest update may be used, improving the phase noise because a required oscillator control voltage/current is split into two parts—one fix DC voltage/current (extreme low noise) and one small additional amount of control voltage/current provided by the loop filter 160.

In the phase lock loop 115, for the oscillator 150 of PLL unit 120, a pretune may be combined with an automatic update while even working with nonlinear "frequency vs. control" functions. Without requiring any knowledge of a designed-in transfer function of the oscillator 150, the settling time may be improved. For multiband/multistandard mobile communication systems, wide tuning (frequency agile) applications with literally no performance degradation may be supported.

Furthermore, a built-in calibration may be provided for the phase lock loop 115. The pretune and update units 130,

135 may be used for an automatic calculation of a "figure of merit," enabling a design centering. The pretune and update units 130, 135 may further be used for an automatic loop-gain adjustment. Most tolerance problems may be avoided due to the "update" capability. The pretune and update units 130, 135 may be relatively easy to integrate since no high speed functions may needed and a simple analog to digital and digital to analog converters may be sufficient. Using the pretune and update units 130, 135, a reconfigurable wide tuning frequency generator may be built for mobile communication systems, i.e., one PLL may be used for all applications. The PLL unit 120 may monitor the actual PLL control voltage/current.

Figure 2:
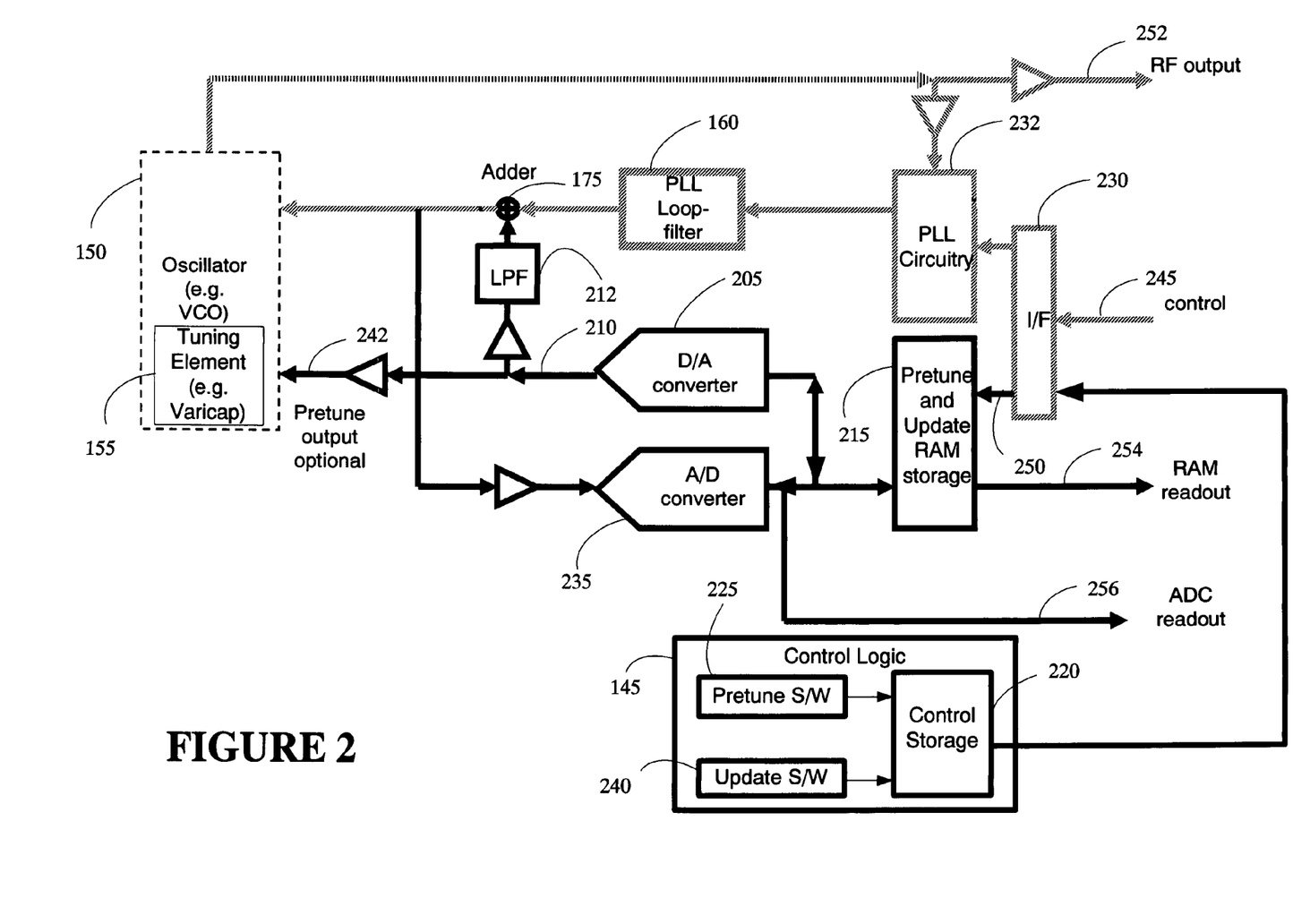
FIG. 2 shows a PLL pretune and update extension of a standard PLL for the phase lock loop shown in FIG. 1 in accordance with one illustrative embodiment of the present invention.

Referring to FIG. 2, a PLL pretune and update extended configuration (in solid) of a standard PLL (in hatched) is depicted for selectively pretuning and updating the phase lock loop 115, as shown in FIG. 1, in accordance with one illustrative embodiment of the present invention. For example, the PLL pretune and update extended configuration may be independently used in a base station and a mobile station, such as handsets or terminals since some handset applications and some base station applications may be designed for wide tuning.

In the PLL pretune and update extended configuration, the pretune unit 130 may comprise a digital to analog converter (DAC) 205 with a digital to analog output 210 coupled to a conventional low pass filter (LPF) 212. The pretune unit 130 may further comprise a random access memory (RAM) storage 215 coupled to the DAC 205 and a control storage 220 storing instructions for the control logic 145. Specifically, a pretune software (S/W) module 225 of the control logic 145 enables the pretune unit 130 to interface with the micro controller 190, the DAC 205 and/or the RAM storage 215 using a control interface (I/F) 230 coupled to PLL circuitry 232 of the standard PLL.

Likewise, the update unit 135 further comprises an analog to digital converter (ADC) 235 coupled to the RAM storage 215 and the control storage 220 storing instructions for the control logic 145. An update software (S/W) module 240 of the control logic 145 enables the update unit 135 to interface with the micro controller 190, the ADC 235 and/or the RAM storage 215 using the control I/F 230 of the standard PLL. The PLL circuitry 232 may comprise a number of blocks, but not limited to, a reference clock input with a buffer amplifier, a RF input with a buffer amplifier, a programmable counter to divide the reference frequency, a programmable counter to divide the RF frequency (i.e., the oscillator 150 output signal), a phase comparator for comparing the divided reference and the divided RF frequencies, an out of lock circuitry, a voltage and/or current output stage for the phase comparator, a programmable gain of output stages, and some output signals for monitoring internal signals.

An automatic loop gain adjustment may be achieved by the control logic 145 S/W, in one embodiment. By calculating a difference of two adjacent RAM cells of the RAM storage 215, which is indirectly proportional to the VCO-sensitivity, information for automatically adjusting a loop gain of the PLL 115 may be obtained. This information may be used to change the gain of the phase comparator. The automatic loop gain adjustment may function is built inside of the PLL circuitry 232.

The output of the loop-filter 160 of the standard PLL may be coupled to the adder 175 which receives input from the LPF 212. The adder 175 may couple the oscillator 150 to the PLL circuitry 232 via the loop filter 160. An optional pretune output 242 may be provided to the oscillator 150 from the DAC 205 to control a second tuning element (e.g., a Varicap) of the oscillator 150. In response to a control signal 245 to the control I/F 230, according to one embodiment, the pretune software (S/W) module 225 and the update software (S/W) module 240 of the control logic 145, may issue a trigger signal 250 to the pretune unit 130 and the update unit 135, using the RAM storage 215. In turn, the oscillator 150 may respond by providing a radio frequency (RF) output 252 from the standard PLL. Likewise, a RAM readout 254 may be provided from the RAM storage 215 and an ADC readout 256 from the ADC 235.

In operation, the integrated circuit 110 may be tuned to a desired frequency (channel). The control logic 145, e.g., software (S/W) or hardware programs the PLL 115 to a new desired frequency. In parallel, the control logic 145 S/W may calculate a related RAM address (e.g. channel numbers from 585 to 1020; than the channel number "585" is related to the RAM address "0"). The output of the RAM storage 215 may be connected to the adder 175, providing a pretune voltage. This pretune voltage may directly control the tuning element (e.g., a variable capacitor (Varicap)) 155 of the oscillator (e.g., VCO) 150, setting the oscillator 150 to a frequency which is approximately the desired frequency. The PLL 115 may tune the output of the loop filter 160 to a voltage in such way, that both (the sum of the DAC 205 output 210 and the loop-filter 160 voltage is substantially the control voltage which steers oscillator 150 to the desired frequency.

Pretuning of the PLL 115 may take place when the control logic 145 S/W changes the RAM address of the RAM storage 215 to the address number which is related to the new frequency (channel number). Updating of the PLL 115 may take place when the control logic 145 S/W delivers an A-to-D conversion command and stores the new ADC 235 output into the RAM storage 215 without changing the RAM address. The control logic 145 S/W may check if the integrated circuit 110 has changed it parameters. For example, this check may be performed by starting a new A-to-D conversion of the current control voltage and comparing it to the address number stored in the RAM storage 215 under the related RAM address. If both values are significantly different, the control logic 145 S/W concludes that some parameters (e.g. temperature) of the integrated circuit 110 have been changed. The control logic 145 S/W may decide to make an update by taking the new actual ADC readout 256 and storing it back in the RAM storage 215. The ADC converter 235 may provide an approximately "exact" pretune via the adder 160 to the tuning element 155 of the oscillator 150 (i.e., the Varicap of the VCO). A residual or fine tuning portion of the tuning voltage may be provided by an analog voltage generated inside of the loop filter 160.

The oscillator 150 may have a characteristic, such as a designed-in oscillator transfer function, a particular output "frequency vs. control voltage" function. The particular output "frequency vs. control voltage" function may be determined by the oscillator 150 circuit design, i.e., a number of Varicaps used or a special oscillator architecture deployed. Furthermore, this characteristic may be influenced by a lot of component parameters. Therefore, the output "frequency vs. control voltage" function characteristic is tolerance sensitive and leads to a variation from part to part causing a production spread. Conventionally, a calibration works by adjusting the oscillator 150 (e.g. a VCO trim-cap) where an actual control voltage delivers a defined frequency. Instead, according to one embodiment of the present invention, the calibration works by changing the control voltage (i.e., pretuning). Moreover, tolerances of the oscillator 150 may be compensated by changing the pretune voltage.

In one embodiment, the PLL 115 may handle a nonlinear "frequency vs. control voltage" function of the oscillator 150. Normally, the oscillator 150, e.g., a voltage controlled oscillator (VCO) may be described by a "VCO sensitivity, Kv" in terms of MHz/V. This means, changing the control or tuning voltage by about 1V may lead to a change of the output frequency of about certain MHz. For example, the "VCO sensitivity, Kv=50 MHz/V" means that a change of the control or tuning voltage of 1V leads to a frequency change of about 50 MHz. However, in practice this parameter Kv is not constant. In most applications, therefore, the Kv is not independent of an absolute value of the control or tuning voltage. In other words, at a lower frequency (i.e., a lower control or tuning voltage) the Kv may be 40 MHz/V and at a higher frequency the Kv may be 75 MHz/V. So, the Kv is a function of the absolute value of the control or tuning voltage.

Figure 3:
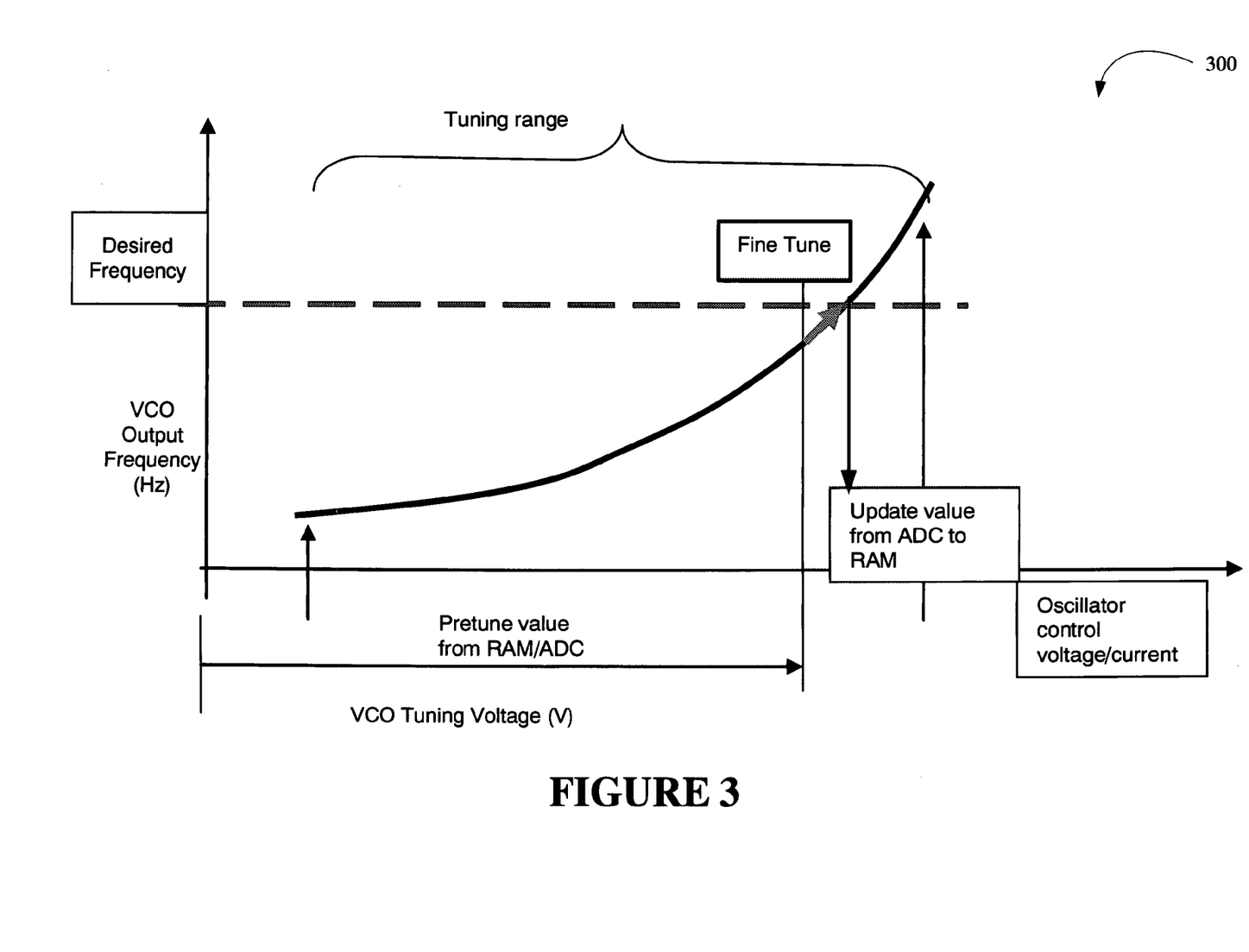
FIG. 3 depicts an exemplary chart of an oscillator output frequency (Hz) vs. an oscillator tuning voltage (V) for the phase lock loop shown in FIG. 1 consistent with one illustrative embodiment of the present invention.

As shown in FIG. 3, an exemplary chart 300 depicts an oscillator output frequency (Hz) vs. an oscillator tuning voltage (V) relationship (a higher tuning voltage leads to a higher output frequency) for the phase lock loop 115, as shown in FIG. 1, consistent with one illustrative embodiment of the present invention. The PLL pretune and update extended configuration, as shown in FIG. 2, may respond to changes in the oscillator 150 characteristics, e.g., by delivering a specific information of an actual oscillator (e.g., VCO) sensitivity (MHz/V) to be used to set an internal gain of the PLL 115, in one embodiment. By applying a pretune voltage of about (a long arrow in x-axis), the oscillator 150 may change its frequency to approximately a desired frequency. The output of the loop filter 160 is added to the pretune voltage, tuning the PLL 115 to the final (desired) frequency (a small arrow in x-axis). However, the loop filter 160 output is only a small portion of the complete tuning voltage applied to the oscillator 150. Therefore, the PLL 115 has only to tune the oscillator 150 over a small portion of the x-axis.

To determine a settling time, the PLL 115 may be tuned (switched) from a lowest frequency to a highest frequency (or vice versa) and a frequency error is measured within a defined time interval. The frequency error is the difference of the actual PLL frequency to the desired (final) frequency. The PLL's 115 output frequency converges to the desired (programmed) frequency with a zero residual frequency error if the time goes to infinity. A test may be carried out for the time interval the PLL 15 needs to achieve a residual frequency error of (e.g. 0.05 ppm). However, the noise of the PLL 115 (phase jitter) may influence this measurement.

The phase noise of the PLL 115 may be a random phase jitter. In the PLL 115, the phase noise may be defined in a frequency domain. Due to the phase noise (phase modulation due to noise), an output sinusoidal signal of the PLL 115 may be modulated. By measuring the spectrum in a defined offset of the carrier, the phase noise in dBc/Hz may be obtained. To improve the phase noise, a very small corner frequency of the loop may be designed to provide a low noise but a slow response. To improve the settling time, a high corner frequency may be designed to provide a fast response time but a noisy PLL.

In one embodiment, one or more characteristics from the oscillator 150 may be obtained, e.g., a statistics of the VCO tuning range and the VCO sensitivity may be taken. However, since both of these parameters may be influenced by a host of factors, such as component tolerances, temperature and supply voltage, using the pretune unit 130 and the update unit 135 the PLL 115 may accommodate for a variation of an oscillator tuning range and/or a variation of an oscillator tuning sensitivity (MHz/V). If the change of the tuning range is relatively large, the loop filter 160 of the PLL unit 120 may not be able to tune the oscillator 150 to a desired frequency. On the other hand, if the tuning sensitivity is relatively high, the dynamic behaviour of the PLL 115 and the noise performance may be unduly influenced.

To obviate some of these problems, an alignment by hand or an automatic alignment by a laser trimming technique may be obtained. For example, a self alignment may be built-in, measuring the oscillator 150 parameters (e.g., the tuning voltage and the tuning sensitivity), to tune the PLL 115 to a predefined value. Because the tuning sub-ranges may be influenced by parameters, such as component tolerances, thermal drift, supply voltage drift and aging, extreme wide tuning sub-ranges may be used in order to cover a tolerance problem. All these parameters may be calculated, e.g., for a worst case analysis, so that a tuning sub-range covers a worst case frequency drift.

Initially, the PLL 115 may be tuned to a plurality of desired frequencies (e.g., from a lowest frequency to a highest frequency). The related tuning voltages may be A/D converted by the ADC 235 and the converted values may be stored in the digital storage 140. A lowest voltage may be related to the lowest frequency and is stored in the digital storage 140 with, e.g., a lowest RAM address. After completing the initialisation, the digital storage 140 may hold the desired tuning voltages corresponding to the plurality of desired frequencies, whereas the lowest frequency may be related to the lowest address in the digital storage 140. That is, the lowest address in the digital storage 140 may be related to the lowest frequency (i.e., or a channel number) and the digital storage 140 contents under this address may be related to a corresponding tuning voltage. In this way, one or more actual new valid "frequency vs. control" characteristics of the oscillator 150 may be mapped to the digital storage 140.

Figure 4A:
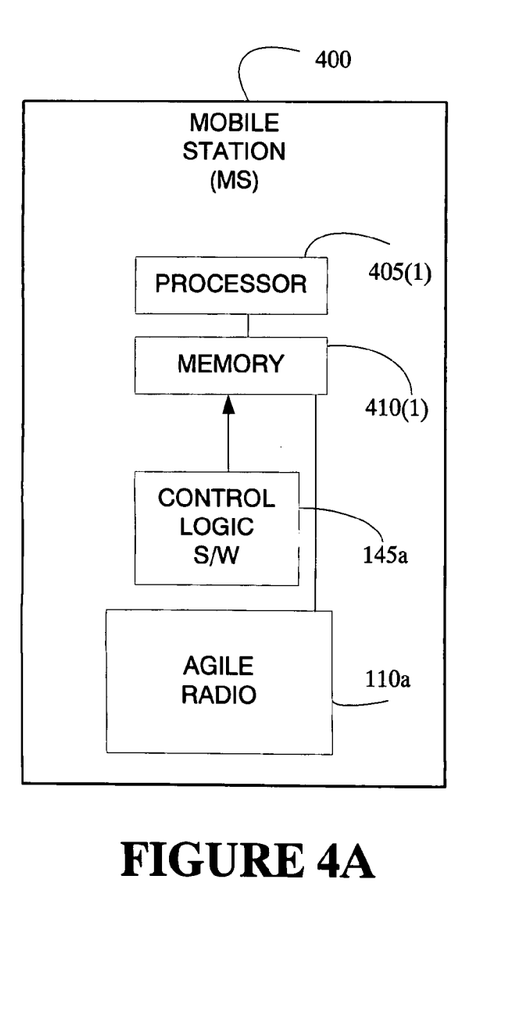
FIG. 4A illustrates a mobile station (MS) including the agile radio shown in FIG. 1 in accordance with one illustrative embodiment of the present invention.

Referring to FIG. 4A, a mobile station (MS) 400 associated with the telecommunication 100 includes the integrated circuit, i.e., an agile radio 110a shown in FIG. 1 in accordance with one illustrative embodiment of the present invention. The agile radio 110a may be a wideband radio or an ultra wideband radio, frequencies of which may be reconfigurable in a multiband and/or multistandard mobile communication network. The mobile station 400 may comprise a first processor 405(1) coupled to a first memory 410(1) storing a control logic software (S/W) module 145a to control the agile radio 110a.

Figure 4B:
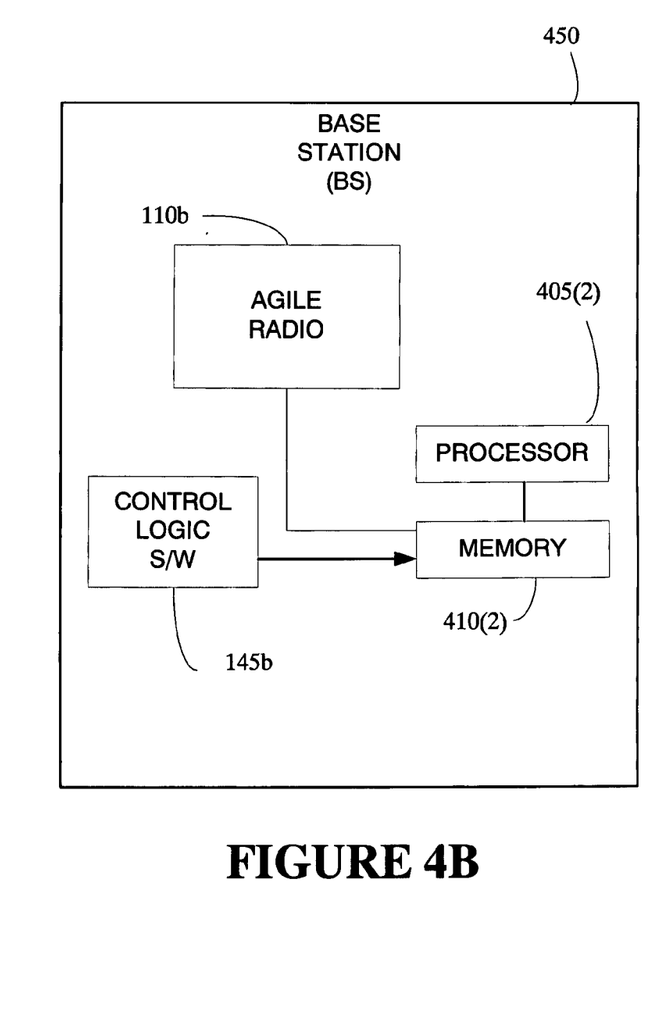
FIG. 4B illustrates a base station (BS) including the agile radio shown in FIG. 1 in accordance with one illustrative embodiment of the present invention.

Referring to FIG. 4B, a base station (BS) 450 associated with the telecommunication 100 includes an agile radio 110b shown in FIG. 1 in accordance with one illustrative embodiment of the present invention. The agile radio 110b may be a wideband radio or an ultra wideband radio, frequencies of which may be reconfigurable in a multiband and/or multistandard mobile communication network. The base station 450 may comprise a second processor 405(2) coupled to a second memory 410(2) storing a control logic software (S/W) module 145b to control the agile radio 110b.

The agile radios 110a and 110b may be fabricated on an integrated circuit (IC) chip using complementary metal oxide semiconductor (CMOS) silicon technology. The agile radios 110a and 110b may support different wireless communication technologies available for a device including a laptop computer, a mobile phone and a desktop computer. The agile radios 110a and 110b may switch between different networks and frequencies based on availability or local government regulations, allowing wireless device makers to support multiple wireless networks. For example, the agile radios 110a and 110b may tune and tweak its operation to operate in several frequency ranges, such as 10 GHz, enabling it to tune down to lower frequencies, for example, in 30 KHz steps.

In operation, the agile radios 110a and 110b may overcome overcrowding of airwave—a fundamental shortcoming of the spectral design involving a disproportionate allocation of frequencies, shifts the traffic by steering some data out of busy channels and into less trafficked channels. The agile radios 110a and 110b may search for idle channels among a host of potential frequencies rather than waiting for its own allocated channel to become available. When the agile radios 110a and 110b need a channel, for example, defined by frequency and power, to allow communication without interference, airwaves may be searched as a resource, using spectrum more efficiently. In this manner, the agile radios 110a and 110b may communicate over a broad range of frequencies at once (spread spectrum), adapting to a local communication environment.

Figure 5:
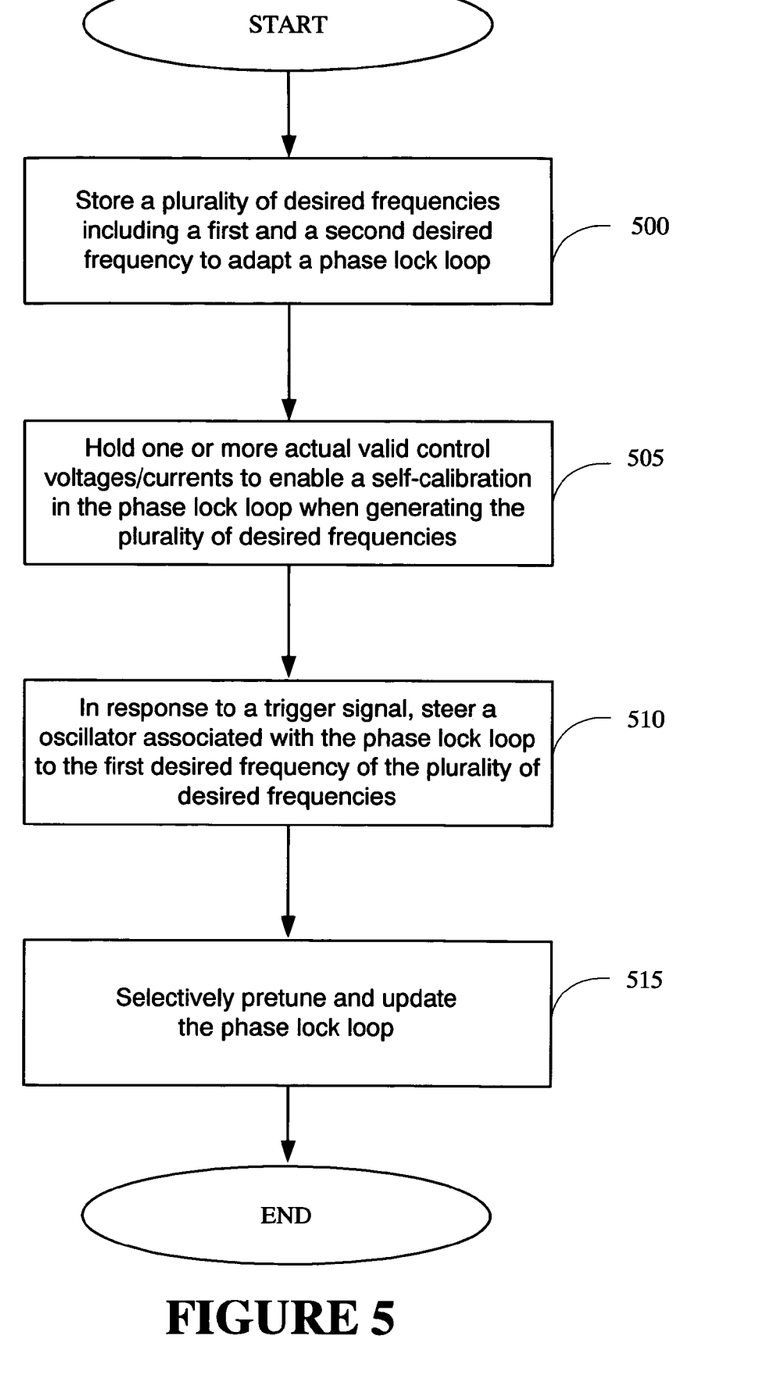
FIG. 5 illustrates a stylized representation of a method for selectively pretuning and updating the phase lock loop shown in FIG. 1 according to one illustrative embodiment of the present invention.

Referring to FIG. 5, a stylized representation of a method is illustrated for selectively pretuning and updating the phase lock loop 115 shown in FIG. 1 according to one illustrative embodiment of the present invention. At block 500, a plurality of desired frequencies including a first and a second desired frequency may be stored in the RAM storage 215 shown in FIG. 2 to adapt the phase lock loop 115. One or more actual valid control voltages/currents may be held at the RAM storage 215 to enable a self-calibration in the phase lock loop 115 when generating the plurality of desired frequencies, as indicated in block 505. In response to the trigger signal 250, the frequency generator circuit 125 may steer the oscillator 150 associated with the phase lock loop 115 to the first desired frequency of the plurality of desired frequencies, at block 510. In this manner, the pretune unit 130 and the update unit 135 may selectively pretune and update the phase lock loop 115, as shown at block 515.

Figure 6:
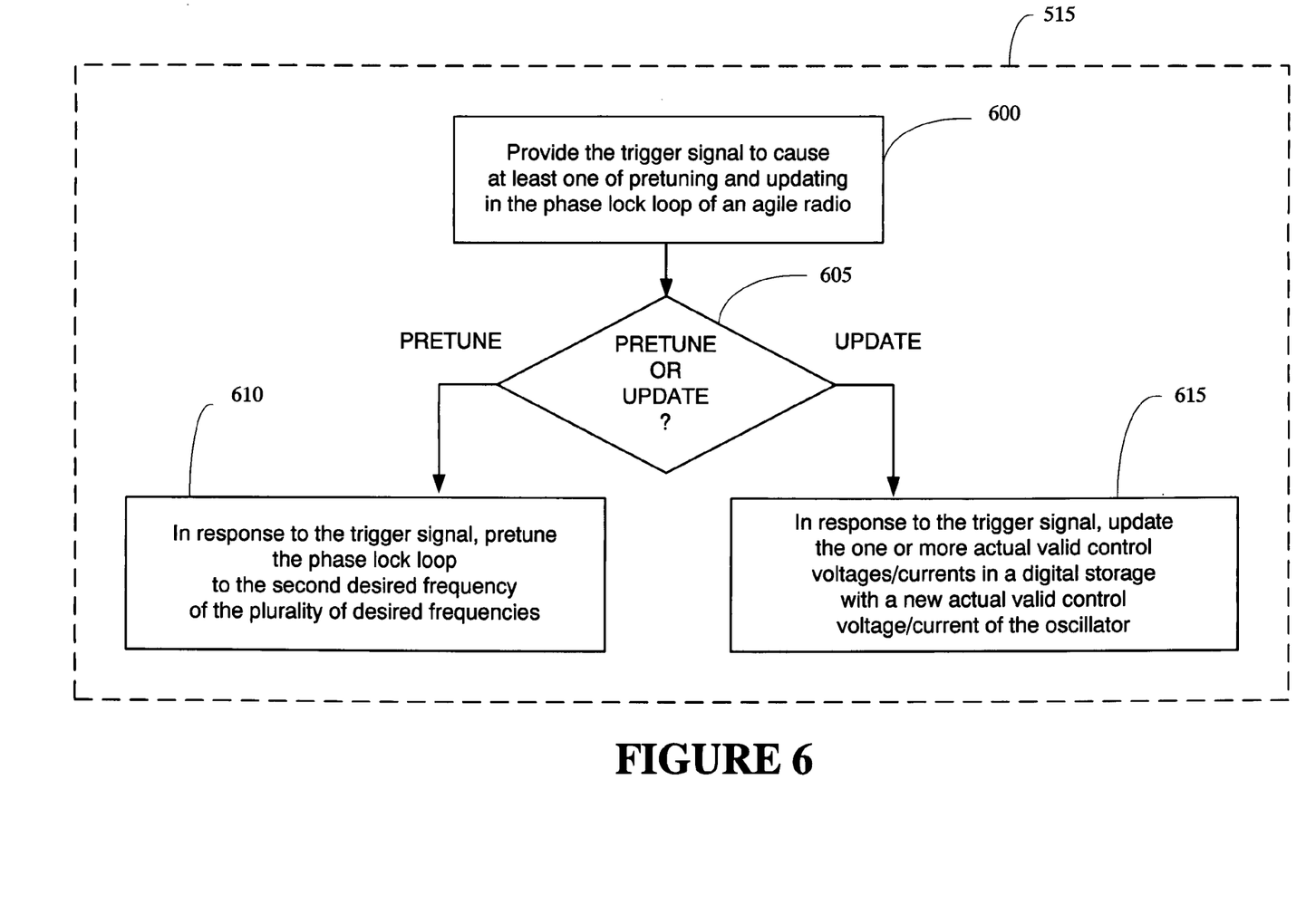
FIG. 6 illustrates a stylized representation of the method shown in FIG. 5 according to one illustrative embodiment of the present invention.

Referring to FIG. 6, a stylized representation of the method shown at block 515 in FIG. 5 is depicted according to one illustrative embodiment of the present invention. At block 600, the control I/F 230 of FIG. 2 may provide the trigger signal 250 to the pretune unit 130 and/or the update unit 135 to cause at least one of pretuning and updating in the phase lock loop 115 of the agile radios 110a and 110b shown in FIGS. 4A and 4B, respectively. A decision block 605 may determine whether or not a pretuning and/or an updating of the phase lock loop 115 are indicated. In response to the trigger signal 250, pretuning of the phase lock loop 115 to the second desired frequency of the plurality of desired frequencies may occur at block 610. Conversely, at block 615, in response to the trigger signal 250, updating may occur of the one or more actual valid control voltages/currents in the RAM storage 215 with a new actual valid control voltage/current of the oscillator 150 in the agile radios 110a and 110b shown in FIGS. 4A and 4B, respectively.

While the invention has been illustrated herein as being useful in a telecommunications network environment, it also has application in other connected environments. For example, two or more of the devices described above may be coupled together via device-to-device connections, such as by hard cabling, radio frequency signals (e.g., 802.11(a), 802.11(b), 802.11(g), Bluetooth, or the like), infrared coupling, telephone lines and modems, or the like. The present invention may have application in any environment where two or more users are interconnected and capable of communicating with one another.

Those skilled in the art will appreciate that the various system layers, routines, or modules illustrated in the various embodiments herein may be executable control units. The control units may include a microprocessor, a microcontroller, a digital signal processor, a processor card (including one or more microprocessors or controllers), or other control or computing devices as well as executable instructions contained within one or more storage devices. The storage devices may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions, when executed by a respective control unit, causes the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. A phase lock loop comprising:
a digital storage to store information relating to a first desired frequency;
an oscillator to provide an oscillator frequency; and
a frequency generator circuit capable of producing at least one control signal based on said information relating to said first desired frequency in said digital storage, wherein said frequency generator circuit causes said oscillator to adapt the oscillator frequency based on said first desired frequency in response to a trigger signal by determining a change in said at least one control signal using said digital storage and selectively updating said information relating to said first desired frequency in said digital storage.

2. A phase lock loop, as set forth in claim 1, further comprising:
a control logic to provide the trigger signal to cause at least one of pretuning said phase lock loop to a second desired frequency of a plurality of desired frequencies and updating one or more actual valid control voltages/currents in said digital storage with a new actual valid control voltage/current of said oscillator to adapt said phase lock loop.

3. A phase lock loop, as set forth in claim 1, further comprising:
a phase lock loop unit coupled to said frequency generator circuit and includes a loop filter having an output; and
a tuning element associated with said oscillator to provide an oscillator frequency.

4. A phase lock loop, as set forth in claim 3, wherein said frequency generator circuit further comprises:

an adder having an output; and a pretune unit to apply a pretune voltage to said tuning element to cause said oscillator to calibrate the oscillator frequency to said first desired frequency, wherein said adder coupled to add an output voltage at the output of said loop filter to the pretune voltage to tune the output voltage of said loop filter so as to set the oscillator frequency substantially at the first desired frequency.

5. A phase lock loop, as set forth in claim 4, wherein said frequency generator circuit further comprises:

an update unit coupled to said pretune unit to automatically determine whether one or more parameters of said phase lock loop unit have changed to dynamically update the pretune voltage.

6. An integrated circuit comprising:

a phase lock loop unit including a loop filter having an output and an oscillator with an associated tuning element to provide an oscillator frequency, and a digital storage to store information relating to a plurality of desired frequencies for tuning the oscillator frequency; and a frequency generator circuit including an adder having an output, said frequency generator circuit coupled to said phase lock loop unit for determining a change in at least one control signal using said digital storage and selectively updating said information relating to a desired frequency in said digital storage, said frequency generator circuit including:

a pretune unit to apply a pretune voltage to said tuning element to cause said oscillator to calibrate the oscillator frequency to the desired frequency, wherein said adder is configured to add an output voltage at the output of said loop filter to the pretune voltage to tune the output voltage of said loop filter such that to set the oscillator frequency substantially at the desired frequency, and an update unit coupled to said pretune unit to automatically determine whether one or more parameters of said phase lock loop unit have changed to dynamically update the pretune voltage.

7. An integrated circuit, as set forth in claim 6, wherein said frequency generator circuit further comprises:

a control logic to cause said pretune unit to generate a tuning voltage associated with a new frequency channel and to cause said update unit to compensate for a change in one or more characteristics of said oscillator.

8. An integrated circuit, as set forth in claim 6, further comprising:

a micro controller to program said phase lock loop unit.

9. An integrated circuit, as set forth in claim 6, wherein said pretune unit further comprises:

a digital to analog converter with a digital to analog output;

a random access memory coupled to said digital to analog converter; and a storage storing instructions based on said control logic to interface with at least one of said micro controller, said digital to analog converter and said random access memory.

10. An integrated circuit, as set forth in claim 9, wherein said phase lock loop unit further comprises:

a servo circuit coupled to said loop filter to lock a phase lock loop in said phase lock loop unit, wherein said phase lock loop unit tunes the output of said loop filter to a voltage in such way that both the sum of the digital to analog output and the output of said loop filter is substantially a control voltage which steers said oscillator to the desired frequency.

11. An integrated circuit, as set forth in claim 6, wherein said update unit further comprises:

an analog to digital converter;

a random access memory coupled to said analog to digital converter; and a storage storing instructions based on said control logic to interface with at least one of said micro controller, said analog to digital converter and said random access memory.

12. An integrated circuit, as set forth in claim 6, wherein said integrated circuit includes an agile radio.

13. An integrated circuit, as set forth in claim 12, wherein said agile radio is a wideband radio frequency of which is reconfigurable in a multiband and/or multistandard mobile communication network.

14. An integrated circuit, as set forth in claim 12, wherein said agile radio is an ultra wideband radio frequency of which is reconfigurable in a multiband and/or multistandard mobile communication network.

15. An integrated circuit, as set forth in claim 12, wherein said agile radio is disposed in a mobile station associated with a telecommunication system.

16. An integrated circuit, as set forth in claim 12, wherein said agile radio is disposed in a base station associated with a telecommunication system.

17. A telecommunication system comprising:

an agile radio having a phase lock loop including:

a digital storage to store information relating to a plurality of desired frequencies including a first and a second desired frequency and to hold information relating to one or more actual valid control voltages/currents to adapt said phase lock loop;

an oscillator coupled to said digital storage;

a self-calibrating frequency generator circuit to steer said oscillator to said first desired frequency of said plurality of desired frequencies in response to a trigger signal by determining a change in at least one control signal using said digital storage and selectively updating said information relating to said first desired frequency in said digital storage for tuning an oscillator frequency based on a change in one or more characteristics of said oscillator; and a control logic to provide the trigger signal to cause at least one of pretuning said phase lock loop to said second desired frequency of said plurality of desired frequencies and updating of said information relating to one or more actual valid control voltages/currents in said digital storage with a new actual valid control voltage/current of said oscillator.

18. A telecommunication system, as set forth in claim 17, wherein said agile radio is disposed in a mobile station associated with a multiband and/or multistandard mobile communication wireless network.

19. A telecommunication system, as set forth in claim 17, wherein said agile radio is disposed in a base station associated with a multiband and/or multistandard mobile communication wireless network.

20. A method for selectively pretuning and updating a phase lock loop, the method comprising:

storing information relating to a plurality of desired frequencies including a first and a second desired frequency to adapt said phase lock loop;

holding one or more actual valid control voltages/currents to enable a self-calibration in said phase lock loop when generating said plurality of desired frequencies; and in response to a trigger signal, steering an oscillator associated with said phase lock loop to said first desired frequency of said plurality of desired frequencies and determining a change in at least one control signal based on said stored information relating to said first desired frequency and selectively updating said information relating to said first desired frequency.

21. A method, as set forth in claim 20, further comprising:
providing the trigger signal to cause at least one of pretuning and updating in said phase lock loop.

22. A method, as set forth in claim 21, further comprising:
in response to said trigger signal, pretuning said phase lock loop to said second desired frequency of said plurality of desired frequencies.

23. A method, as set forth in claim 22, further comprising:
in response to said trigger signal, updating said one or more actual valid control voltages/currents in a digital storage with a new actual valid control voltage/current of said oscillator in an agile radio.

24. An apparatus for selectively pretuning and updating a phase lock loop, the apparatus comprising:

means for storing information relating to a plurality of desired frequencies including a first and a second desired frequency to adapt said phase lock loop;

means for holding one or more actual valid control voltages/currents to enable a self-calibration in said phase lock loop when generating said plurality of desired frequencies; and means for steering an oscillator associated with said phase lock loop to said first desired frequency of said plurality of desired frequencies in response to a trigger and determining a change in at least one control signal using said digital storage and selectively updating said information relating to said first desired frequency.

25. An apparatus, as set forth in claim 24, further comprising:

means for providing the trigger signal to cause at least one of pretuning and updating in said phase lock loop.

* * * * *